United States Patent [19]

Takahashi et al.

[11] Patent Number: 4,691,330
[45] Date of Patent: Sep. 1, 1987

[54] DUTY CONTROL CIRCUIT FOR GRADUALLY REDUCING THE DUTY TIME

[75] Inventors: Shinichiro Takahashi; Isao Isshiki, both of Osaka, Japan

[73] Assignee: Sumitomo Electric Industries, Ltd., Osaka, Japan

[21] Appl. No.: 844,478

[22] Filed: Mar. 26, 1986

[30] Foreign Application Priority Data

Mar. 29, 1985 [JP] Japan .............................. 60-44890[U]

[51] Int. Cl.$^4$ ............................................. H03K 21/00
[52] U.S. Cl. ....................................... 377/39; 307/265
[58] Field of Search .............................. 377/39, 47, 48; 307/265, 231; 328/146; 364/769; 315/82, 291, 194, 199, 287, DIG. 4

[56] References Cited

U.S. PATENT DOCUMENTS 4,396,869 8/1983 Rosenbaum et al. ................ 315/194
4,408,142 10/1983 Wilje ..................................... 315/82

Primary Examiner—Stanley D. Miller
Assistant Examiner—Karl Ohralik
Attorney, Agent, or Firm—Harness, Dickey & Pierce

[57] ABSTRACT

A duty control circuit for controlling a duty factor in various industrial applications is proposed. It comprises a n-pulse counter, a m-pulse counter, another n-pulse counter, and a magnitude comparator. The magnitude comparator compares the count of the first counter with the count of the third counter and the duty control circuit gives a signal corresponding to ON when the former is larger than or equal to the latter and a signal corresponding to OFF when the former is smaller than the latter.

1 Claim, 3 Drawing Figures

DUTY CONTROL CIRCUIT FOR GRADUALLY REDUCING THE DUTY TIME

BACKGROUND OF THE INVENTION

The present invention relates to a duty control circuit used to change gradually the duty factor, e.g. the ratio of OFF period to ON period for the current supplied to a lamp, thereby dimming the lamp gradually.

In recent years, centralized control for automobiles has become more and more advanced. In controlling the ON-OFF of a courtesy or interior lamp as one of the controls for automobiles, the courtesy lamp is sometimes required to dim gradually when it is turned off by a timer some time after a certain switch has been turned off. But, no suitable digital integrated circuit meeting such a requirement has been available.

SUMMARY OF THE INVENTION

An object of the present invention is to provide a duty control circuit which can meet such a requirement.

The duty control circuit in accordance with the present invention can be formed by use of digital integrated circuits and makes it possible to control the duty factor e.g. of a courtesy lamp for automobiles in any desired manner.

Other objects and advantages of the present invention will become apparnt from the following description taken with respect to the accompanying drawings.

DETAILED DESCRIPTION OF THE PREFERRED EMBODIMENT

Figure 1:
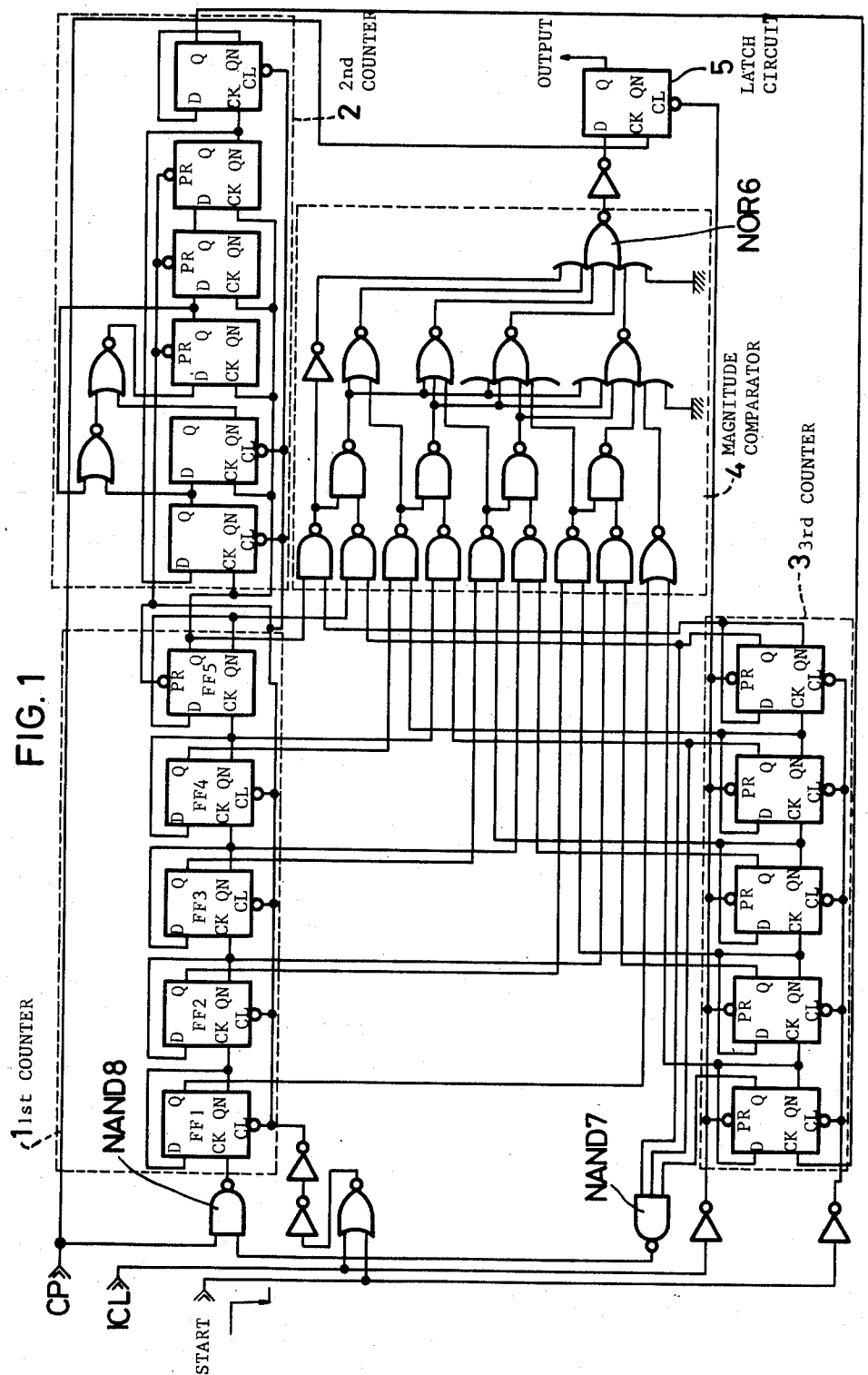
FIG. 1 is a circuit diagram of a duty control circuit embodying the present invention.

Referring to FIG. 1, clock pulses CP of a predetermined period are given to a first counter circuit 1 comprising a 32-pulse counter. A second counter circuit 2 comprises a 20-pulse counter. Each time the first counter circuit 1 counts number 32, it gives a carry to the second counter 2, which will then count one. Each time the first counter 1 counts from 1 to 32 twenty times, the second counter will give an output to a third counter 3, which is one of the same configuration as the first counter 1 and is a 32-pulse counter. Each time the third counter receives an output from the second counter 2, it will count one.

The first counter 1 is a 5-bit, 32-pulse counter having five flip-flops FF1 to FF5. The outputs of the bits of the first counter 1 are given to eight NAND circuits and one NOR circuit of a magnitude comparator 4 where the count of the first counter 1 is compared with the count held in the third counter 3 in synchronization with each counting by the first counter.

While the count of the first counter is smaller than the count of the third counter, a high-level signal will appear at NOR 6 of the magnitude comparator, so that a low-level signal will be given to a latch circuit 5. The low-level signal will cut off the current for the lamp.

While the count of the first counter is larger than, or equal to the count of the third counter, a low-level signal will appear at NOR 6 of the comparator 4 and a high-level signal is outputted to the latch circuit 5. The high-level signal will pass the current for the lamp.

Thus, the lamp current is controlled in a gradual manner as shown in the table below.

| i (duty cycle) | Count of thrid counter | Duty factor | Number of times same duty is repeated |
| --- | --- | --- | --- |
| 1 | 1 | 1/32 OFF | 20 |
| 2 | 2 | 2/32 OFF | 20 |
| 3 | 3 | 3/32 OFF | 20 |
| . | . | . | . |
| . | . | . | . |
| . | . | . | . |
| 25 | 25 | 25/32 OFF | 20 |
| . | . | . | . |
| . | . | . | . |
| 32 | 32 | 32/32 OFF (100% OFF) | |

In the embodiment shown in FIG. 1, the rate of decrease in the brightness of the lamp can be adjusted as desired by selecting suitably the period $\lambda CP$ of the clock pulse CP, the n value of the first and third counters (maximum number of counts counted) and the m value of the second counter (maximum number of counts counted), so that the brightness will be decreased gradually.

As will be seen from the table above, in the preferred embodiment, the duty factor is gradually decreased from 1/32 OFF to 25/32 OFF, then abruptly to a 100% OFF because blinking with too short intervals would be annoying. For this purpose, in the circuit of FIG. 1, when the third counter 3 counts 25, its output is fed through NAND 7 to NAND 8 in the input circuit of the first counter 1 to stop the first counter from counting.

Figure 2A:
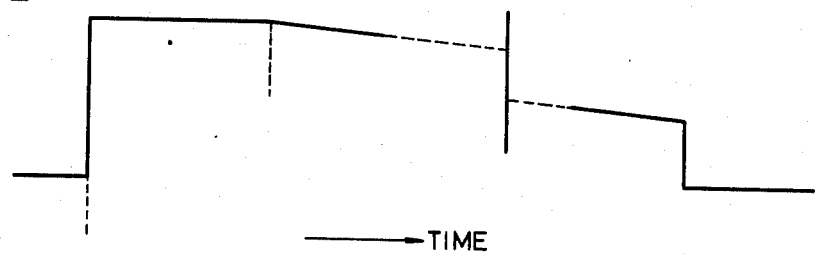
FIG. 2A is a graph showing how the brightness of a courtesy lamp changes with time.

FIG. 2A shows how the lamp dims gradually, controlled by the duty control circuit according to the present invention.

Figure 2B:
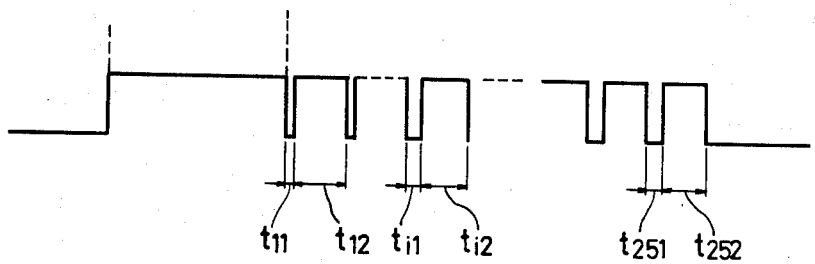
FIG. 2B is an illustration showing how the duty cycle changes.

FIG. 2B is a time chart showing how the output of the duty control circuit according to the present invention changes, with the time axis same as FIG. 2A. As shown in FIGS. 2A and 2B, the lamp is completely turned off by giving the count 25 of the third counter 3 to NAND 8, thereby preventing the clock pulse CP from being given to the first counter 1.

FIG. 2B, the duty factor t11/t12 is 1/31 at minimum in case the first counter is a 32-pulse counter. If a n-pulse counter is used as the first counter 1, the following equation holds good:

$$t_{11}/t_{11}+t_{12}=1/n$$

Generally, $$ti_1/ti_1+ti_2=i/n \; (i=1 \ldots n)$$

In the preferred embodiment, the same duty is repeated twenty times. Generally speaking, the same duty is repeated m times if a m-pulse counter is used as the second counter.

Although the duty control circuit has been described in connection with the control of brightness of a lamp, it may be widely used for any other duty controls required in various industries.

What we claim:

1. A duty control circuit for controlling a duty factor, comprising:

a first n-pulse counter for counting a series of pulses;

a second m-pulse counter connected to said first counter so as to count one each time said first counter counts a predetermined number n;

a third n-pulse counter connected to said second counter so as to count one each time said second counter counts another predetermined number m; and a magnitude comparator which comprises the count of said first counter with the count of said third counter and gives an output signal corresponding to ON when the count of said first counter is larger than, or equal to, the count of said third counter, and gives an output signal corresponding to OFF when the count of said first counter is smaller than the count of said third counter.

* * * * *